United States Patent [19]

Greve et al.

[11] Patent Number: 5,031,184
[45] Date of Patent: Jul. 9, 1991

[54] COOLING ARRANGEMENT FOR A SEMICONDUCTOR PUMP SOURCE

[75] Inventors: Peter Greve, Essingen; Martin Blumentritt, Königsbronn-Ochsenberg; Harald Sakowski, Lauchheim; Karl Brenner, Aalen-Waldhausen, all of Fed. Rep. of Germany

[73] Assignee: Carl-Zeiss-Stiftung, Heidenheim, Fed. Rep. of Germany

[21] Appl. No.: 545,707

[22] Filed: Jun. 29, 1990

[30] Foreign Application Priority Data

Jul. 1, 1989 [DE] Fed. Rep. of Germany ... 8908049[U]

[51] Int. Cl.$^5$ .............................................. H01S 3/04
[52] U.S. Cl. ........................................ 372/34; 372/36; 357/81
[58] Field of Search ................... 372/34, 36; 357/81

[56] References Cited

FOREIGN PATENT DOCUMENTS

| 3706635 | 9/1988 | Fed. Rep. of Germany. |
| 0014180 | 2/1979 | Japan .................................. 372/36 |
| 0053979 | 4/1979 | Japan .................................. 372/36 |

Primary Examiner—Georgia Epps
Attorney, Agent, or Firm—Walter Ottesen

[57] ABSTRACT

The invention is directed to a cooling arrangement for a semiconductor pump source which develops heat during operation. The cooling arrrangement includes a heat sink defining a seat for accommodating the pump source thereon and a cooling channel is formed in the heat sink for conducting a coolant therethrough to remove a major portion of the heat. A Peltier device is connected to the heat sink for finely controlling the temperature of the heat sink so as to permit the semiconductor pump source to emit radiation having a predetermined optional wavelength.

6 Claims, 3 Drawing Sheets

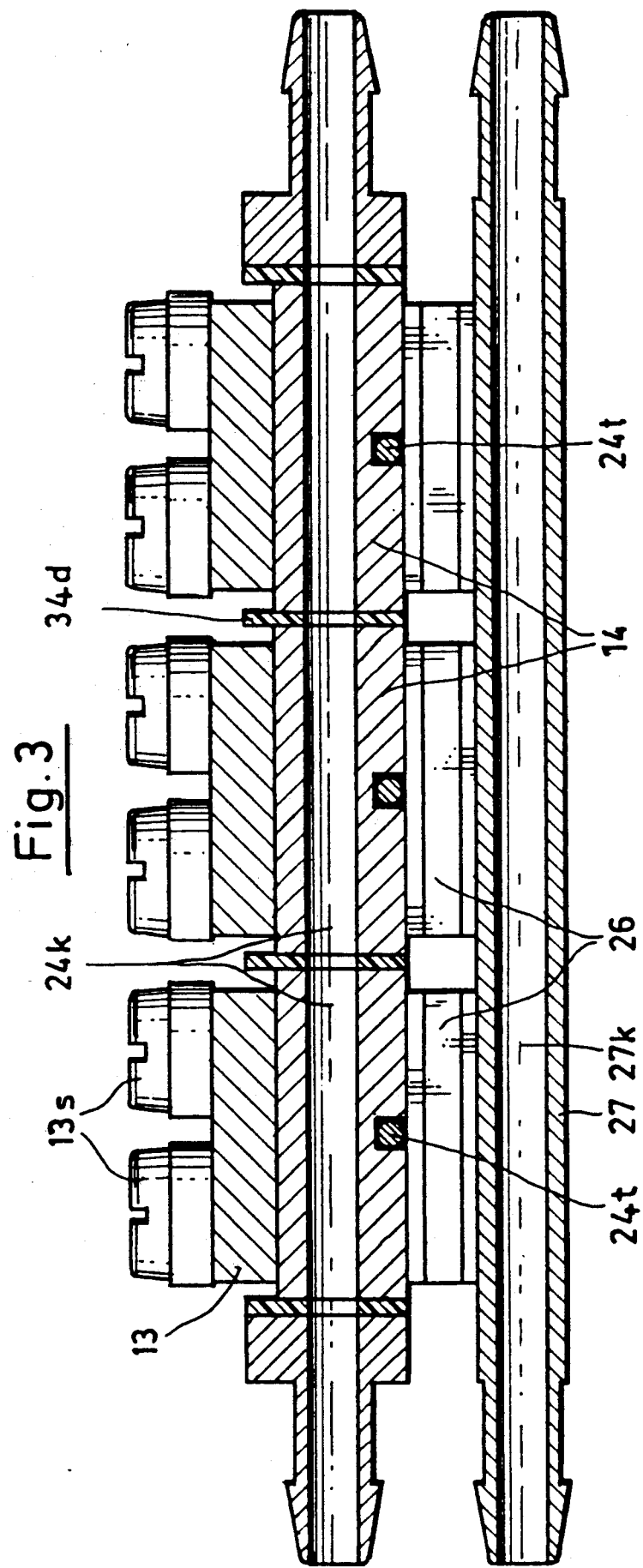

COOLING ARRANGEMENT FOR A SEMICONDUCTOR PUMP SOURCE

FIELD OF THE INVENTION

The invention relates to a cooling arrangement for semiconductor pump sources wherein the semiconductor pump source is mounted on a heat sink which is provided with a temperature sensor and is connected with a Peltier element.

BACKGROUND OF THE INVENTION

Solid state lasers which are pumped by means of semiconductor laser sources have gained in significance in recent times. So-called laser diode arrays are used in order to provide adequately large pump power. The light emitting layer for the laser diode array comprises a plurality of strips. Arrays of this kind are assembled into so-called bars which typically have an edge length of approximately 10 mm and emit an average light power of up to 10 watts. Up to 50 watts of electrical power is required at a conversion efficiency of 20 to 30%. The heat developed must be conducted away since a temperature increase of the emitting layer presents two disadvantages. The life-time of the semiconductor is shortened and the wavelength of the emitted radiation is shifted so that it partly no longer lies in the range which is optimal for pump light absorption.

The bars are conventionally mounted on heat sinks which are usually made of copper. Each of these bars can be manufactured to have a different centroidal wavelength for its emitted radiation which must be matched to the wavelength of maximum absorption of the crystal to be pumped by the adjustment of the operating temperature.

German Patent 3,706,635 discloses that the heat sink or the housing of a laser diode can be connected with a Peltier element and be equipped with a temperature sensor by means of which the adjustment of the required temperature is achieved. It is also known to provide the heat sinks with a temperature-regulating channel and to obtain the desired temperature by means of water cooling.

High pump source outputs for solid state lasers are obtained with arrangements wherein several bars are mounted one next to the other laterally of the solid state crystal. The bars must be mounted so as to be as close to each other as possible and each bar must be individually cooled so that the emitted radiation has the correct centroidal wavelength.

SUMMARY OF THE INVENTION

In view of the above, it is an object of the invention to provide a cooling arrangement for semiconductor pump sources which makes an effective cooling possible with reduced complexity. It is another object of the invention to provide such a cooling arrangement wherein a plurality of bars is mounted tightly one next to the other and where each bar can be cooled to its optimal operating temperature.

According to a feature of the invention, the heat sink is additionally provided with a cooling channel for a coolant. With this additional cooling, the largest part of the developed heat is conducted away and the Peltier element is used only for finely controlling the temperature. In this way, a relatively small Peltier element can be used and, for the situation where a plurality of bars is provided, the Peltier elements can be mounted tightly one next to the other with their heat sinks.

In an advantageous embodiment of the invention, the Peltier elements are not only connected to the heat sinks; but are also seated with their other ends on a common base plate which is cooled by a coolant flowing through a cooling channel.

In an especially advantageous embodiment, the cooling channels are so configured in the heat sinks that a through cooling channel is provided when the plurality of heat sinks is assembled one next to the other. The individual cooling channels of the heat sinks are connected with each other via sealing discs.

BRIEF DESCRIPTION OF THE DRAWINGS

The invention will now be described with reference to the drawings wherein:

FIG. 3 is a section view taken along line III—III of FIG. 1.

DESCRIPTION OF THE PREFERRED EMBODIMENTS OF THE INVENTION

Figure 1:
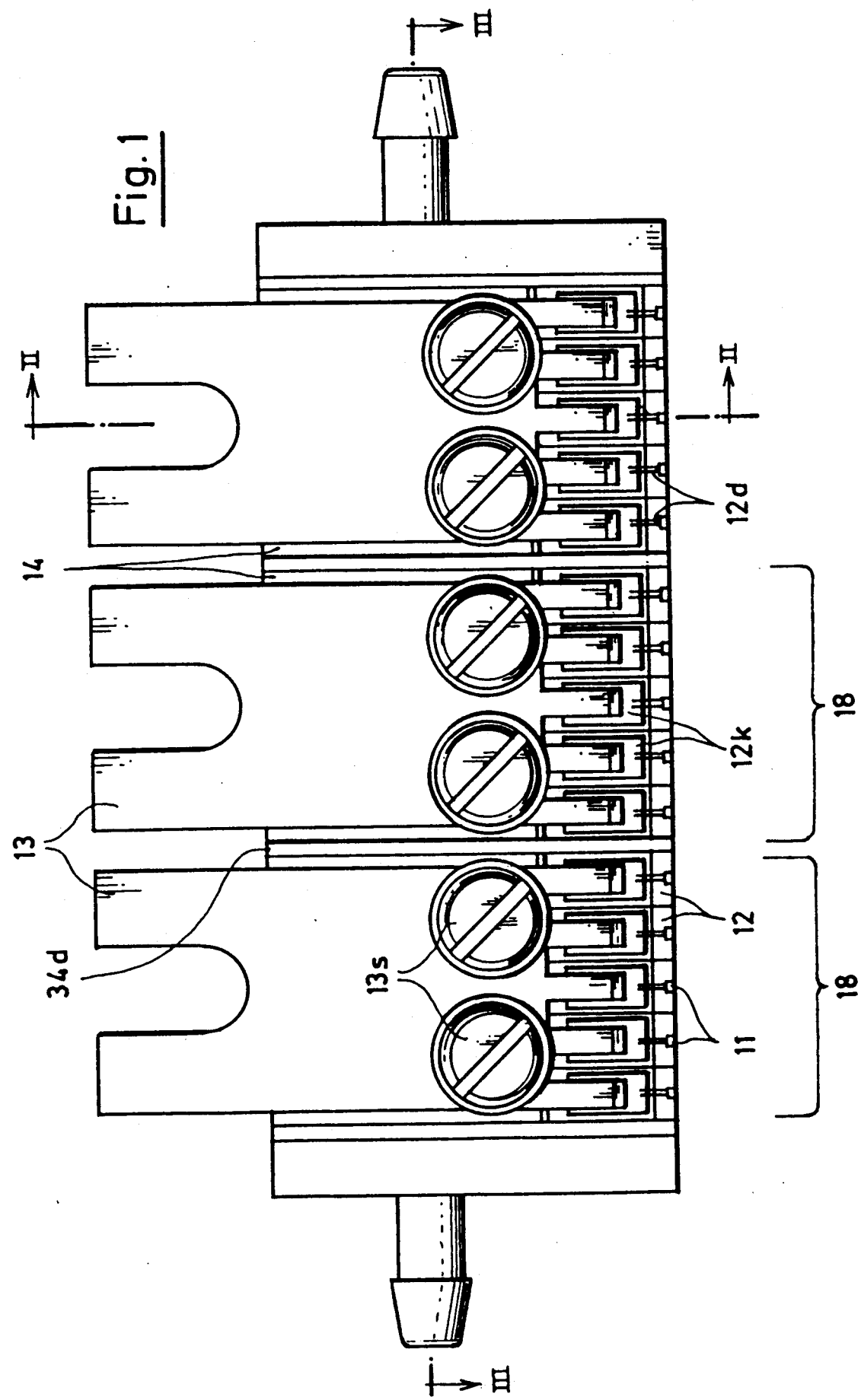
FIG. 1 is a plan view of a cooling arrangement according to the invention in a scale of 5:1.
Figure 2:
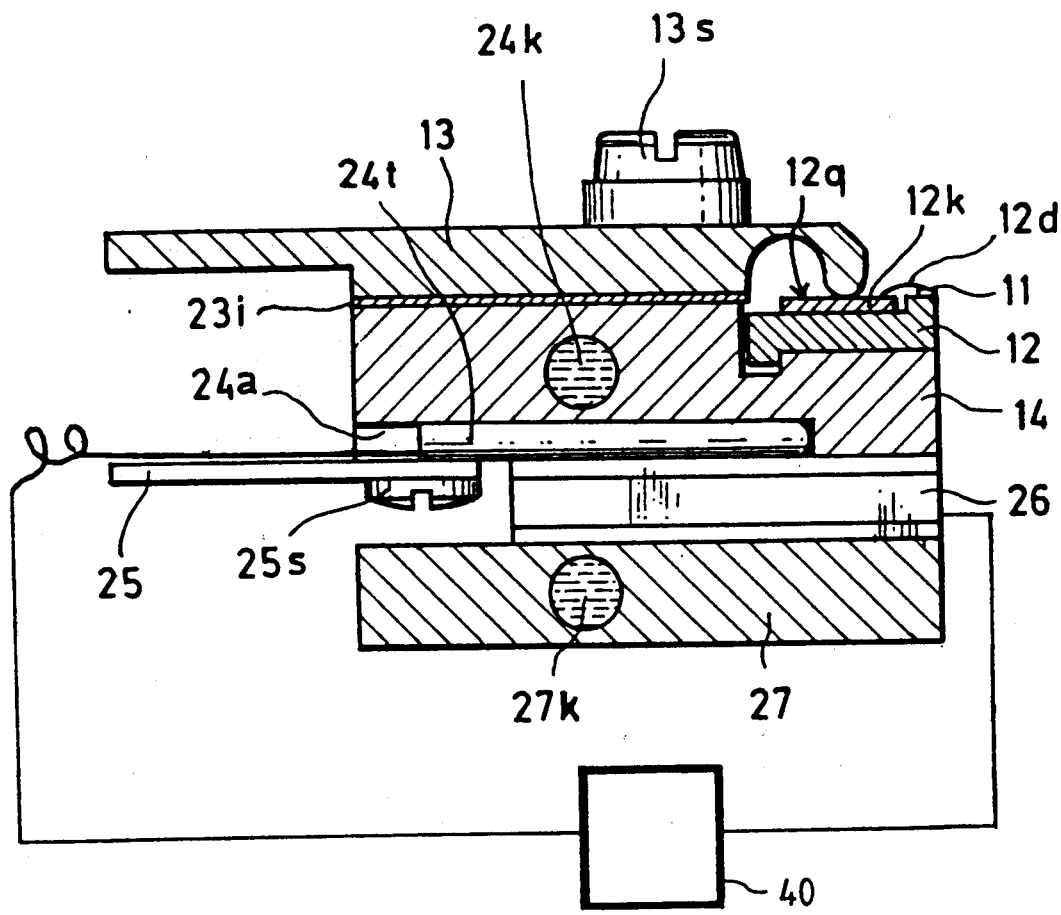
FIG. 2 is a section view taken along line II—II of FIG. 1.

Reference numeral 11 identifies laser diodes in FIGS. 1 and 2. These laser diodes 11 are mounted on diode cooling plates 12 by the manufacturer thereof. Contact plates 12k are also provided on the diode cooling plates 12 by the manufacturer. These contact plates 12k have conductive surfaces 12q and are electrically separated from the electrically conducting diode cooling plates 12 by means of their material (such as aluminum nitrite) or these conducting surfaces 12q are separated from the cooling plates 12 by means of an insulating layer (not shown). The conducting surfaces 12q of the contact plates 12k are bonded with the laser diodes 11 via fine leads 12d. The input from one pole of the supply voltage is provided via these leads, the conducting surfaces 12q and the current conductors 13. The current conductors 13 are attached to the heat sinks 14 with threaded fasteners 13s and are electrically separated from the heat sinks with insulators 23i (FIG. 2). The threaded fasteners 13s are also mounted so that they electrically separate the current conductor 13 from the heat sink 14. The other pole of the supply voltage is provided by the heat sink 14 and the current supplies 25. The diode cooling plates 12 are good conductors of current and heat and are seated on the heat sink 14 while the current inputs 25 are attached directly to the heat sink 14 via threaded fasteners 25s.

The heat sinks 14 have temperature-regulating channels 24k and cutouts 24a in which the temperature sensors 24t are blocked in by means of heat-conducting cement. These temperature sensors are connected to control arrangements 40 which control the current supply of the Peltier elements 26. The Peltier elements 26 are seated between the heat sinks 14 and a base plate 27 shown in FIGS. 2 and 3. Layers of heat-conductive cement provide a good heat contact between the Peltier elements and the base plate 27. The base plate 27 has a temperature-regulating channel 27k and is maintained by temperature-regulating means at a temperature which assures an adequate heat removal for the Peltier elements 26.

The individual cooling channels 24k of the heat sinks 14 are arranged one behind the other as shown in FIG.

3. Sealing discs 34d made of silicon ar provided between individual heat sinks 14. These sealing discs 34d not only provide for a connection of the cooling channels 24k which is seal-tight with respect to the coolant but also provide an adequate heat insulation of the heat sinks 14 with respect to each other.

As shown in FIG. 1, several diode cooling plates 12 are mounted on each heat sink 14. Each diode cooling plate 12 is provided with its laser diodes 11 or diode arrays which are assembled by the manufacturer to so-called bars 18. The diode arrays are selected so that they have the same centroidal wavelength at the same temperature with slight deviations. Since each heat sink 14 has its own Peltier element 26 with a temperature sensor 24t and a control arrangement 40, each bar 18 of laser diodes 11 can be controlled to its individual optimal temperature; that is, each bar of laser diodes can be controlled to that temperature at which the laser diodes emit radiation having the optimal wavelength for the pump light.

The primary part of the heat generated at the laser diodes 11 is conducted away by temperature-regulating means flowing through the temperature-regulating channel 24k. For this reason, the Peltier elements provided for the individual temperature control of the heat sinks can be designed with relatively low cooling capacity so that their dimensions permit the bars 18 to be arranged tightly one next to the other.

A heat-conductive cement suitable for cementing the temperature sensors 24t into the heat sinks 14 is, for example, Stycast 2850 MT of the firm Emerson and Cuming of Heidelberg in the Federal Republic of Germany. A suitable heat-conductive paste for the contact of the Peltier elements 26 with the heat sinks 14 and the cooled base plate 27 is, for example, commercially available under the designation P 12 from Wacker-Chemie, Munich, also in the Federal Republic of Germany.

It is understood that the foregoing description is that of the preferred embodiments of the invention and that various changes and modifications may be made thereto without departing from the spirit and scope of the invention as defined in the appended claims.

What is claimed is:

1. A cooling arrangement for a semiconductor pump source which develops heat during operation, the cooling arrangement comprising:
   a heat sink defining a seat for accommodating the pump source thereon;
   cooling channel means formed in said heat sink for conducting a coolant therethrough to remove a major portion of said heat; and,
   Peltier means connected to said heat sink for finely controlling the temperature of said heat sink so as to permit said semiconductor pump source to emit radiation having a predetermined optional wavelength.

2. The cooling arrangement of claim 1, said Peltier means including a Peltier element mounted on said heat sink; temperature sensor means mounted on said heat sink for detecting the temperature thereof; and, control means for controlling the supply of current to said Peltier element in dependence upon said temperature.

3. The cooling arrangement of claim 1, further comprising: a base plate connected to said Peltier means; and, ancillary cooling means for cooling said base plate.

4. A composite cooling arrangement for a plurality of semiconductor pump sources each developing heat during the operation thereof, the composite cooling arrangement comprising:
   a plurality of heat sinks for accommodating respective ones of said pump sources thereon;
   said heat sinks being mounted in a row one next to the other with each two mutually adjacent ones of said heat sinks conjointly defining a narrow space therebetween;
   each of said heat sinks having a cooling channel formed therein for conducting a coolant therethrough to remove a major portion of the heat developed by the heat source mounted thereon;
   a plurality of Peltier temperature control devices corresponding to respective ones of said heat sinks for finely controlling the temperature of the heat sink; and,
   each Peltier temperature control device including: temperature sensor means mounted on the heat sink corresponding thereto for detecting the temperature thereof; a Peltier element mounted on the heat sink; and, control means for controlling the supply of current to said Peltier element in dependence upon the temperature detected by the temperature sensor means corresponding thereto.

5. The composite cooling arrangement of claim 4, said cooling channels being formed in said heat sinks so as to be aligned and conjointly define a composite continuous channel when said heat sinks are mounted one next to the other; and, a plurality of sealing discs disposed in corresponding ones of the spaces between each two mutually adjacent ones of said heat sinks.

6. The composite cooling arrangement of claim 5, further comprising a base plate connected to said Peltier elements; and, ancillary cooling means for cooling said base plate.

* * * * *